United States Patent

Ko et al.

[11] Patent Number: 6,046,079
[45] Date of Patent: Apr. 4, 2000

[54] METHOD FOR PREVENTION OF LATCH-UP OF CMOS DEVICES

[75] Inventors: Joe Ko, Hsinchu; Chung-Yuan Lee, Chung-Li, both of Taiwan

[73] Assignee: United Microelectronics Corporation, Hsinchu, Taiwan

[21] Appl. No.: 08/790,273

[22] Filed: Jan. 28, 1997

Related U.S. Application Data

[63] Continuation of application No. 08/558,048, Nov. 13, 1995, abandoned, which is a continuation of application No. 08/107,596, Aug. 18, 1993, abandoned.

[51] Int. Cl.[7] .......................... H01L 21/30; H01L 21/335
[52] U.S. Cl. .......................... 438/223; 438/224; 438/237; 438/430
[58] Field of Search .................. 437/64, 67, 70, 437/78; 257/505, 508, 520; 438/223, 224, 361, 430, 237

[56] References Cited

U.S. PATENT DOCUMENTS

| | | | |
|---|---|---|---|
| 4,671,851 | 6/1987 | Beyer et al. | 437/67 |
| 4,805,008 | 2/1989 | Yao et al. | 257/520 |
| 4,884,117 | 11/1989 | Neppl et al. | 257/520 |
| 4,927,777 | 5/1990 | Hsu et al. | 437/44 |
| 4,939,567 | 7/1990 | Kenney | 257/520 |
| 4,960,726 | 10/1990 | Lechaton et al. | 437/59 |
| 5,071,777 | 12/1991 | Gahle | 437/29 |
| 5,096,843 | 3/1992 | Kodaira | 437/31 |
| 5,106,777 | 4/1992 | Rodder | 437/67 |
| 5,137,837 | 8/1992 | Chang et al. | 437/21 |
| 5,158,900 | 10/1992 | Lau et al. | 437/31 |
| 5,200,639 | 4/1993 | Ishizuka | 257/508 |
| 5,348,906 | 9/1994 | Harajiri | 437/54 |

OTHER PUBLICATIONS

Wolf, et al., Silicon Processing, vol. 1, Lattice Press, 1986, pp. 283–291, 303–314.

*Primary Examiner*—T. N. Quach
*Attorney, Agent, or Firm*—Loeb & Loeb, LLP

[57] ABSTRACT

A MOSFET integrated circuit device comprises a lightly doping a semiconductor substrate, with wells formed within the substrate doped with an opposite value dopant, forming a plurality of doped regions within the surface of the substrate and within the surface of the wells, the improvement comprising opening a trench about the periphery of the wells, and filling the trench with a relatively highly conductive material as a guard structure.

19 Claims, 5 Drawing Sheets

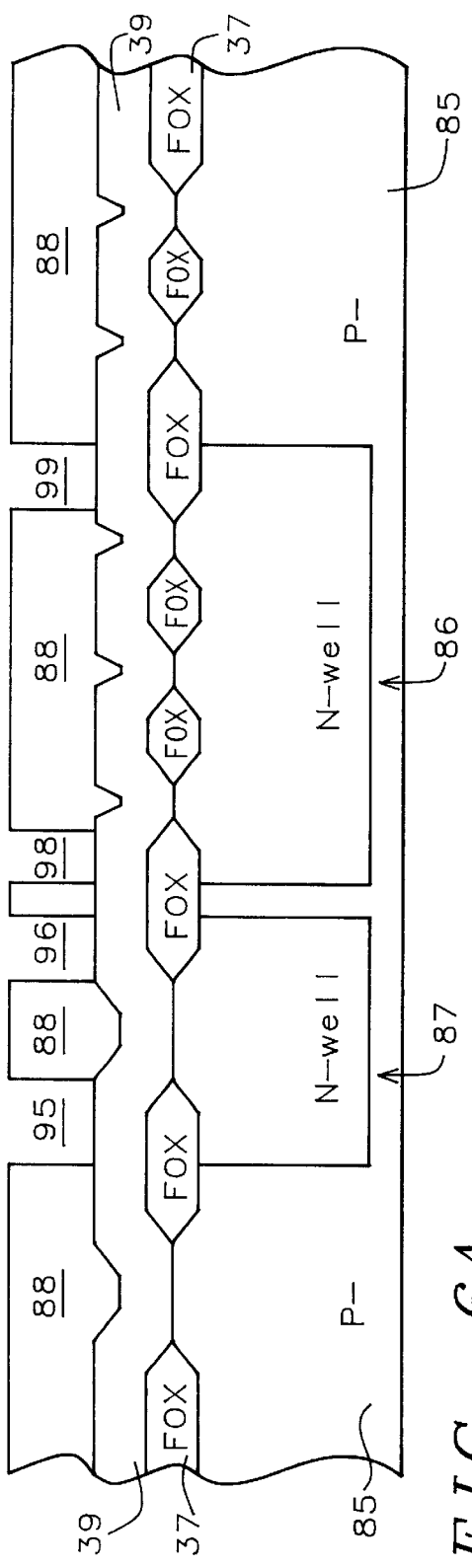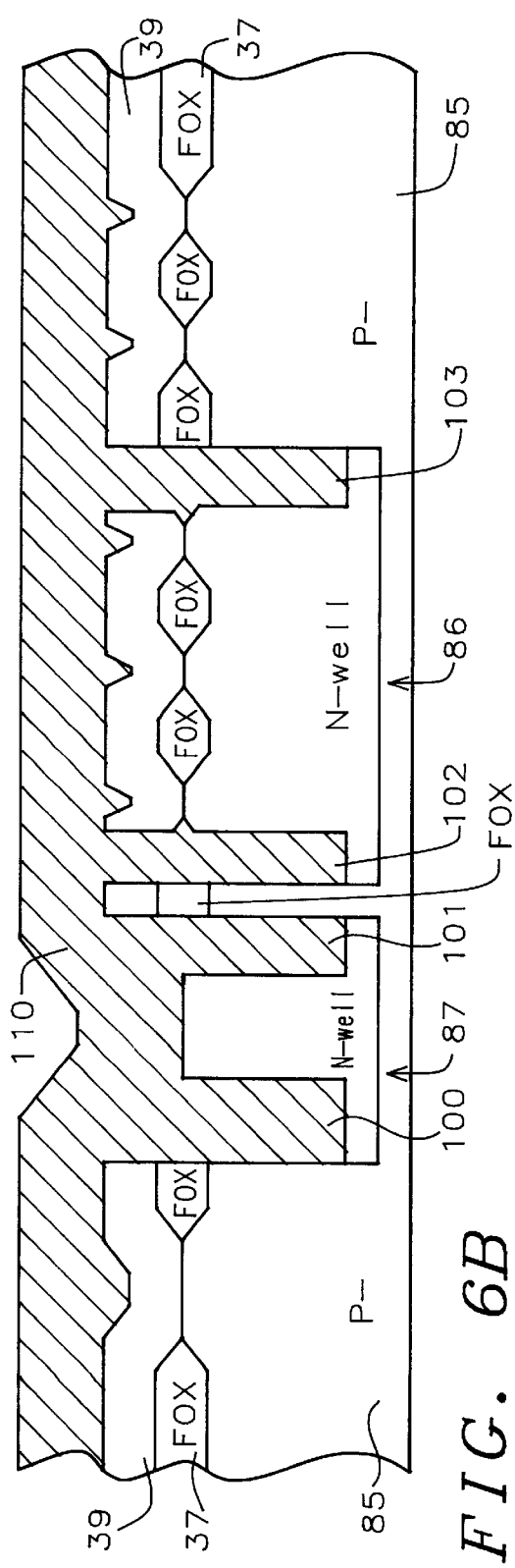

METHOD FOR PREVENTION OF LATCH-UP OF CMOS DEVICES

This application is a continuation of application Ser. No. 08/558,048, filed Nov. 13, 1995 and now abandoned, which was a continuation of application Ser. No. 08/107,596, filed Aug. 18, 1993 and now abandoned.

BACKGROUND OF THE INVENTION

1. Field of the Invention

This invention relates to MOSFET devices and more particularly to prevention of latchup problems therein.

2. Description of Related Art

U.S. Pat. No. 4,927,777 of Hsu et al "Method of Making a MOS Transistor" shows forming trenches about wells of oppositely doped material with insulating material.

U.S. Pat. No. 4,960,726 of Lechaton et al "BICMOS Process" describes deep trenches which are lined with an insulating material such as silicon dioxide and filled with a "filler material" such as polysilicon or an insulator. There are shallow trench structures comprising an insulating material such as silicon dioxide or intrinsic polysilicon.

U.S. Pat. No. 5,071,777 of Gahle "Method of Fabricating Implanted Wells and Islands of CMOS Circuits" protection against latch-up is provided by edge regions which are thermally oxidized to form a field oxide layer.

U.S. Pat. No. 5,096,843 of Kodaira "Method of Manufacturing a Bipolar CMOS Device" employs a trench filled with material formed on the side wall of the trench serving as a barrier against impurities.

U.S. Pat. No. 5,137,837 of Chang et al "Radiation-Hard High-Voltage Semiconductive Device Structure Fabricated on SOI Substrate" and U.S. Pat. No. 5,158,900 of Lau et al "Method of Separately Fabricating a Base/Emitter Structure of a BiCMOS Device" show methods/structures for isolating bipolar, NMOS and PMOS devices within an integrated circuit structure.

Latch-up is a malfunction of MOSFET devices which presents a problem in the design of CMOS integrated circuits. Several solutions have been recommended in the past. One is the use of epitaxial wafers which is not cost effective. Another solution is enlargement of N+ device and P+ device spacing, which will enlarge the die size which is undesirable where smaller size is more desirable. The minority carrier should be recombined in the enlarged spacing, the substrate current $I_b$ (FIG. 1) could be reduced.

An object of the instant invention is to reduce the die size, enhance the immunity to latchup, and provide greater cost effectiveness.

Latchup Mechanism

FIG. 1 shows a physics and lumped circuit model illustrating problem of the latchup mechanism of a CMOS device. The schematic and equivalent circuits of parasitic resistors $R_S$ 35 and $R_W$ 36 and parasitic NPN and PNP bipolar transistors 27 and 31 in the CMOS are drawn as equivalent discrete devices. The CMOS device is formed on a P− doped substrate 10. The bias $V_{SS}$ is connected by line 25 to lines 8 and 9 which are connected to P+ region 11 and N+ region 12. N+ region 12 is the source of an FET device 5 comprising gate 14 (connected by line 17 to $V_{IN}$, and completed by the drain in the form of an N+ region 13 connected by line 16 to $V_{OUT}$. The emitter of NPN equivalent transistor 27 is connected to source region 12 from internally of the substrate 10. The collector of transistor 27 is connected by line 28 to the base of PNP transistor 31 which is shown within the n-well tub 30 in which the other, adjacent FET device 6 is located. The base of transistor 27 is connected to line 38 which connects to one end of equivalent $R_S$ resistor 36, the other end of which is connected to the P+ region 11. Line 38 is also connected via line 34 in well 30 to the collector of transistor 31, the emitter of which is connected via line 33 to P+ region 20 which is the drain of the FET 6, which is biased by $V_{DD}$ source 22 through line 22. $V_{DD}$ is connected via line 7 to N+ region 23 as well, which is connected to one end of $R_W$ which is connected to the base of PNP transistor 31.

A mathematical analysis of the relationships shown by the lumped circuit model of FIG. 1 is set forth below:

$\beta_{npn}$, $\beta_{pnp}$: common–emitter current gain positive feedback condition:

$$(I_b \beta_{npn}\ IRw)\beta_{pnp} - I_{RS} > I_b$$

$R_S$=shunting resistance
$\beta$=device transconductance parameter
$I_{RS}$=current through shunting resistance
$I_b$=current to base of a "parasitic" npn bipolar transistor $$I_b(\beta_{npn}\ \beta_{pnp} - 1) > I_{RS} + I_{RW}\beta_{pnp}$$

$R_W$=Well Resistance
$I_b$ can be expressed in terms of total supply current $I_{DD}$ $$I_{DD} = I_{RS} + I_b\ (\beta_{npn} + 1)$$

$$I_b = (I_{DD} - I_{RS})/(\beta_{npn} + 1)$$

$$\Rightarrow \beta_{npn}\beta_{pnp} > 1 + \frac{(\beta_{npn} + 1)(I_{RS} + I_{RW}\beta_{pnp})}{(I_{DD} - I_{RS})}$$

Known methods of avoiding latchup:
1. Reducing the bipolar gain ($\beta_{npn}$, $\beta_{pnp}$)
2. Lowering the shunting resistances ($R_S$ and $R_W$) Additional relevant factors are as follows:

1. Reduction of the bipolar gain degrades the performance of the FET device.
2. Lowering the $R_S$ (shunting resistance) by using an epitaxial wafer leads to high cost.
3. Lowering the $R_W$ shunting resistance is a good approach.

FIG. 2 shows a partially three dimensional layout of an MOSFET device to illustrate a potential latchup path typical of prior art devices.

In a semiconductor substrate 40 which is doped with P dopant, an N− well 41 contains an N+ structure 42 comprising an N+ well pick-up. Parallel to structure 42 is a P+ structure 43. The structures 42 and 43 are connected to voltage source $V_{CC}$. Adjacent to well 41 extending transversely with respect to the direction of structures 42 and 43 is a structure 44 composed of N+ dopant. Structure 44 is connected to bias source $V_{SS}$. A $V_{CC}$ to $V_{SS}$ path is formed by P+ structure 43, an N− well 41, a P− sub 40, and N+ structure 44, referred to hereinafter as an "SCR" path.

To the right side of FIG. 2, a two dimensional view of an N+ region 47 another N− well 50 is shown with a P+ region 48 connected via line 46 to $V_{I/O}$ and a N+ region 49 connected to $V_{CC}$. A number of electrons are shown in the bulk of the substrate 40 adjacent to N+ region 47. Negative charge 52 is referred to as a minority carrier injection into N− well 50 which has the effect when the $V_{I/O}$ undershooting below the P− ($V_{SS}$, the minority carrier (electron) injected from the N+ to the P− (substrate.) An electron 51 is shown approaching the N− well 41 and it indicates the need to insert a conductive guard structure in accordance with this invention. The electrons form the substrate current. The conductive guard ring structure must be inserted between the N+ region 47 and the N− well 41 to collect the electrons.

FIG. 3A shows a prior art P− semiconductor substrate 55 with a conventional approach to the problem of latchup wherein a space of 100 μm is provided between the N+ region 60 and the N-well 56 to the right. N+ regions 60 and 61 are shown in the P− substrate connected to I/O and $V_{DD}$ respectively. In the N− well 56 the N+ regions 62, 64 and P+ region 63 are connected respectively to $V_{dd}$. The N+ region 66 and the P+ region 68 are both connected by line 69 to $V_{SS}$. The N+ region 61 which is connected to source $V_{DD}$ is the guard ring structure to collect the electrons to avoid going through the resistor 58 and the resistor 59. The voltage drop in the resistor will turn on the P+/N− well to form the P+ region 63, N− well 56, P− substrate 55, N+ region 66 SCR path. The guard ring structure efficiency is poor which cannot collect most of the electron path where the resistor 58 and resistor 59 are shown in the possible electron paths.

FIG. 3B shows a prior art P− semiconductor substrate 75 with an N-well guard ring structure approach to the problem of latchup. The N+ region 80 is shown in the P− substrate connected to I/O, but unlike FIG. 3A, the N+ region 81 is in a new N− well 77 of its own connected to $V_{DD}$. In the N− well 76 the N+ regions 82, 84 and P+ region 83 are connected. The guard ring structure efficiency for the N+ region 81 in an N− well 77 is better than when it is N+ only. The resistor 79 is the possible electron path which decreases the conductivity provided by the resistors 58 and 59 which are shown in FIG. 3A.

SUMMARY OF THE INVENTION

Applicants have discovered that lowering the $R_W$ shunting resistance is an excellent new approach to improving the relevant parameters. A conductor, having a relatively high conductivity (low resistance) is placed about the periphery of wells or tubs in the substrate to prevent parasitic transistors from causing latchup.

A MOSFET integrated circuit device comprises a lightly doping a semiconductor substrate, with wells formed within the substrate doped with an opposite value dopant, forming a plurality of doped regions within the surface of the substrate and within the surface of the wells, the improvement comprising opening a trench about the periphery of the wells, and filling the trench with a relatively highly conductive material.

In accordance with this invention, a MOSFET integrated circuit device is made by the process of fabrication of the MOSFET integrated circuit devices, comprising
a) lightly doping a semiconductor substrate,
b) forming wells within the substrate doped with an opposite value dopant,
c) forming a plurality of doped regions within the surface of the substrate and within the surface of the wells,
d) opening trenches along the periphery of the wells, and
e) filling the trenches with a relatively highly conductive material.

Preferably, the highly conductive material in the trench is selected from polysilicon material and metallic materials.

Preferably, the dopant is implanted with a dose of more than about E16 atoms/cm², preferably, within the range between about E16 atoms/cm² and about E18 atoms/cm².

Preferably, the dopant is implanted with an energy of greater than about 50 keV in a high current implanter type of tool.

Preferably, the trench is etched to a depth on the order of 2–3 μm deep and no more than the well depth.

Preferably, the highly conductive material in the trench comprises a polysilicon material or a metallic material, the dopant is implanted with a dose of more than about E16 atoms/cm², the dopant is implanted with an energy of greater than about 50 keV in a high current implanter type of tool, and the trench is etched to a depth on the order of 2–3 μm deep and no more than the well depth.

Preferably, the highly conductive material in the trench comprises a polysilicon material or a metallic material, the dopant is implanted with a dose of between about E16 atoms/cm² and about E18 atoms/cm², the dopant is implanted with an energy of between about 50 keV and about 100 keV in a high current implanter type of tool, and the trench is etched to a depth on the order of 2–3 μm deep and no more than the well depth.

BRIEF DESCRIPTION OF THE DRAWINGS

The foregoing and other aspects and advantages of this invention are explained and described below with reference to the accompanying drawings, in which:

FIGS. 6A and 6B illustrate the process required to form the conductive guard structures.

DESCRIPTION OF THE PREFERRED EMBODIMENT

The instant invention enhances the immunity to latchup thereby achieving a major objective of this invention while at the same time reducing the die size, and providing greater cost effectiveness than in the prior art.

Figure 1:
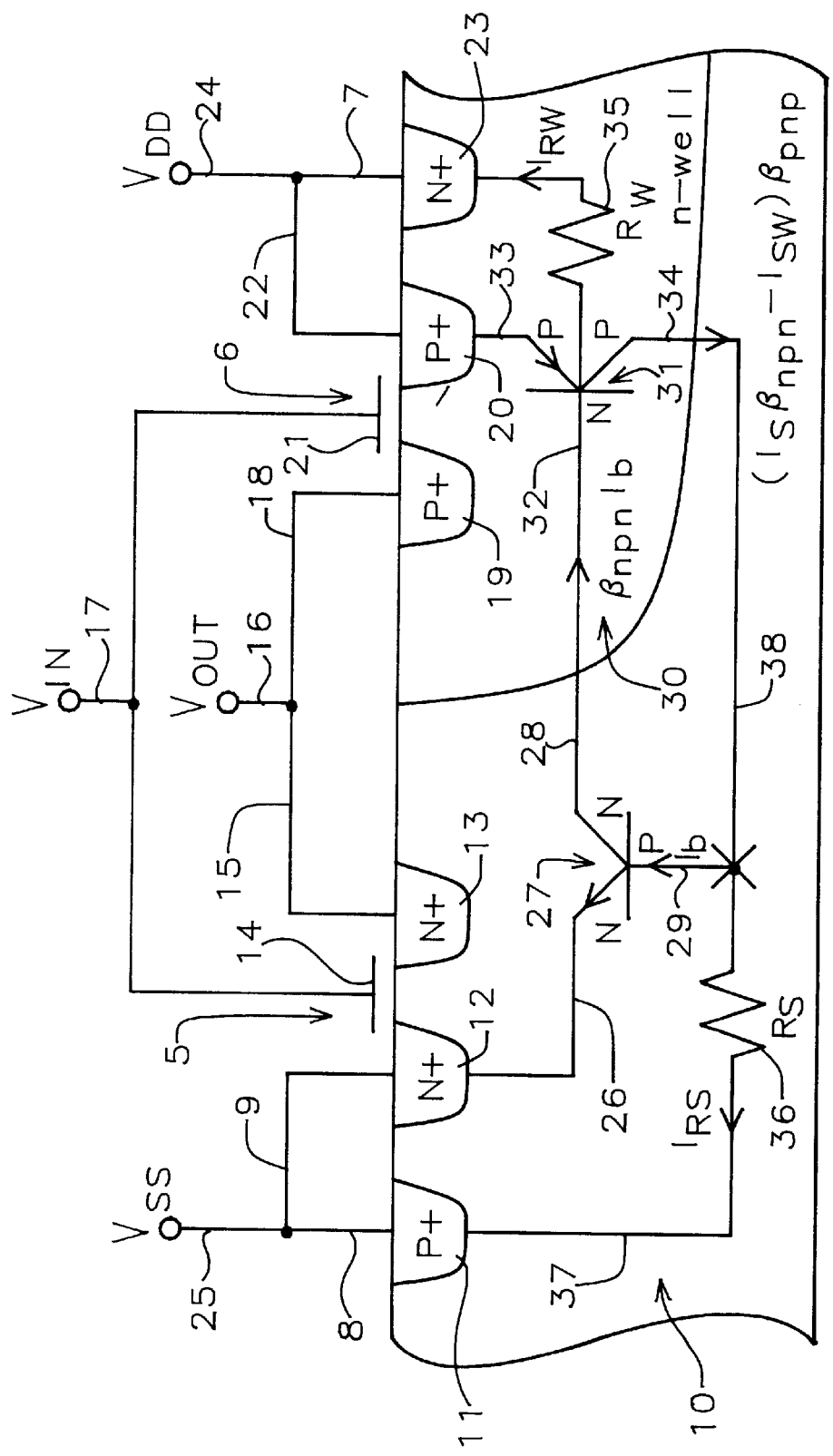
FIG. 1 shows a physics and lumped circuit model illustrating problem of the latchup mechanism of a CMOS device.
Figure 2:
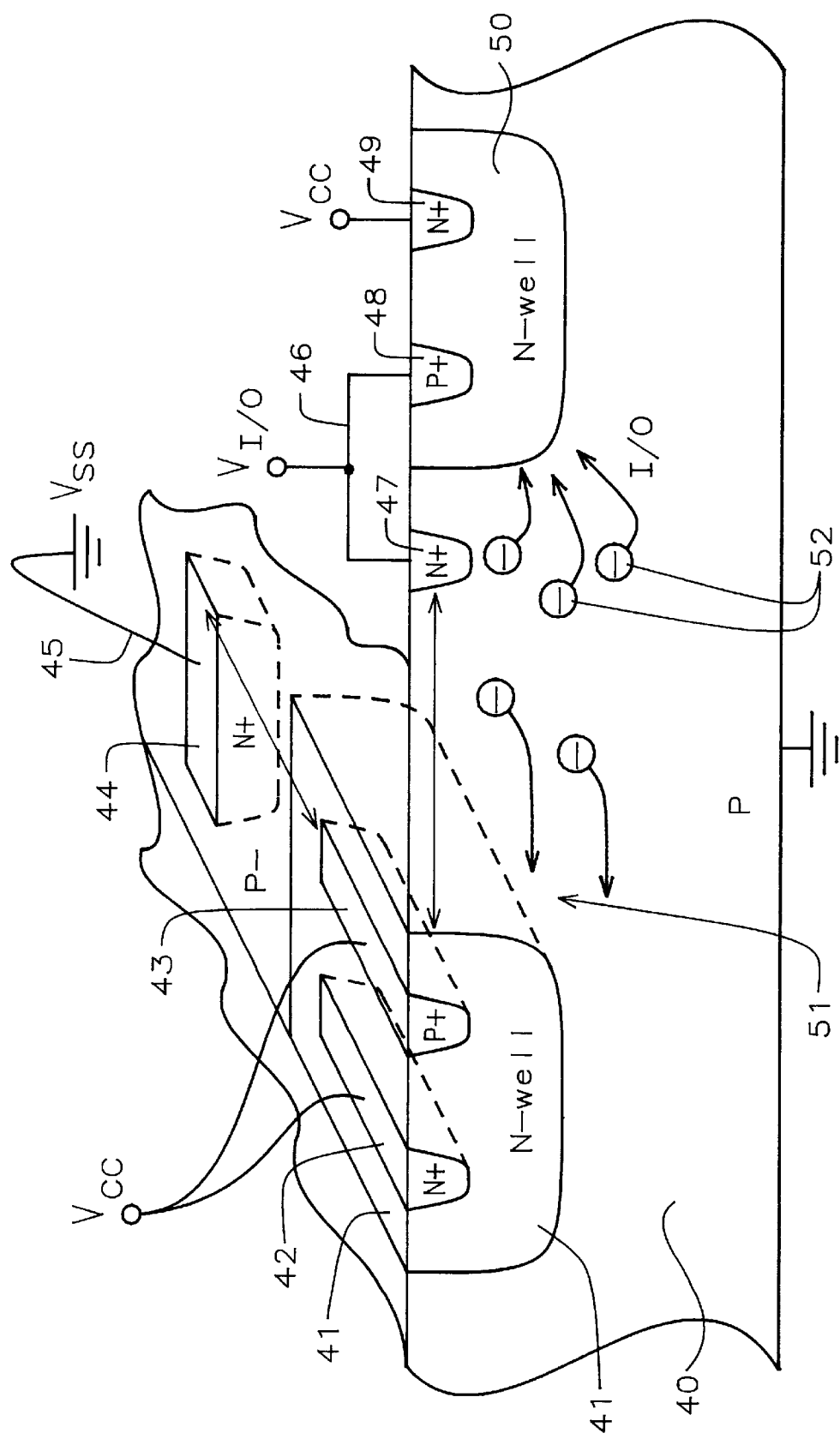
FIG. 2 shows a partially three dimensional layout of an MOSFET device to illustrate a potential latchup path typical of prior art devices.
Figure 3A:
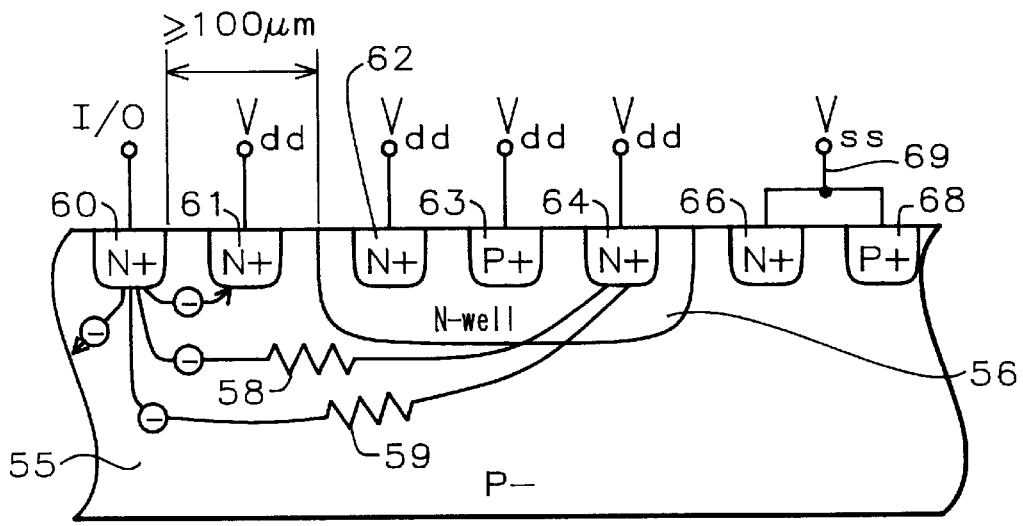
FIG. 3A shows a prior art P− semiconductor substrate with a conventional approach to the problem of latchup wherein a space is provided between an N+ region and an N-well.
Figure 3B:
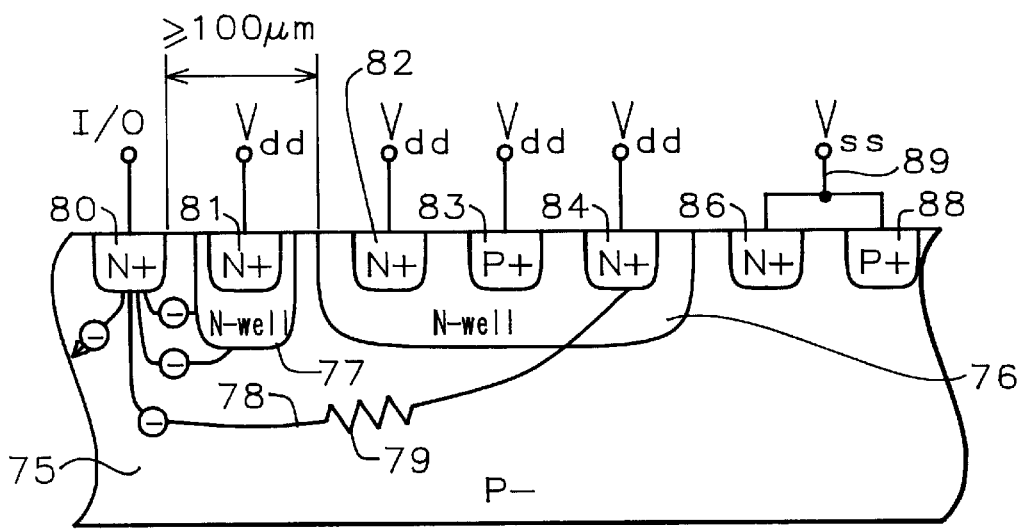
FIG. 3B shows a prior art P− semiconductor substrate with an N-well guard ring structure approach to the problem of latchup N+ region shown in the P− substrate connected to I/O, but unlike FIG. 3A, the N+ region is in a new N− well of its own.
Figure 4:
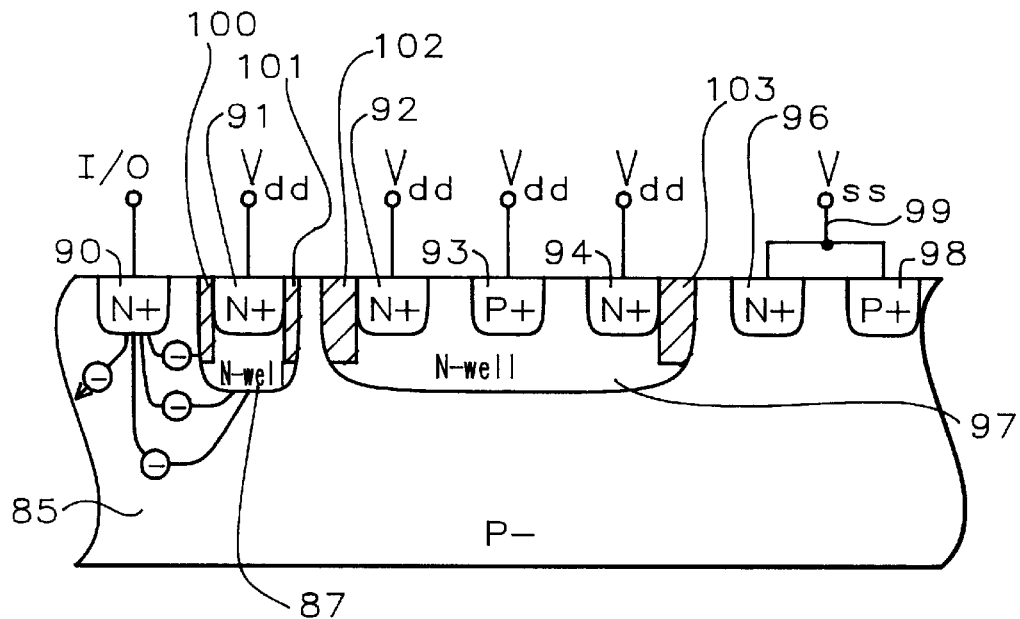
FIG. 4 shows an embodiment of the present invention in which the type of structure shown in FIG. 3B has been modified by the introduction of conductive guard structures into trenches juxtaposed with the interfaces between the bulk of the P− semiconductor substrate and the wells.

FIG. 4 shows an embodiment of the present invention in which the type of structure shown in FIG. 3B has been modified by the introduction of conductive guard structures 100, 101, 102 and 103 into trenches 95, 96, 98 and 99 juxtaposed with the interfaces between the bulk of the P− semiconductor substrate 85 and the wells 96 and 98 which are connected to $V_{SS}$ by line 89. The trenches are no deeper than the N wells and P wells with which they are associated and preferably between about 2 μm and about 3 μm deep when the wells are between about 3 μm and about 4 μm deep. Alternatively, the trenches are between about 1.5 μm and about 2.5 μm deep when the wells are between about 2 μm and about 3 μm deep. The conductive guard structures in the trenches are metal or preferably highly doped polysilicon. Within the guard structures 100 and 101, the N-well 87 protects the N+ region 91. The N+ region 90 is shown in the P− substrate connected to I/O, but unlike FIG. 3B, the well 87 is improved by rings 100 and 101. In the N− well 86, the N+ regions 92, 94, and P+ region 93 are connected respectively to $V_{dd}$. The periphery of well 86 is improved by the guard structures 102 and 103.

The guard structures 100 and 101 improve the guard structure efficiency which provides a deeper substrate current collector than the N+ region. The guard structure 100 and guard structure 101 are filled with highly conductive (low resistance) conductor material to reduce the well resistance and improve the guard structure efficiency. The guard structures 102 and 103 make the N− well resistance lower than the conventional value, which improves the latchup immunity. Most of the electrons can be collected by the improved well 87 with guard structures 100 and 101 which reduce the substrate current.

Figure 5:
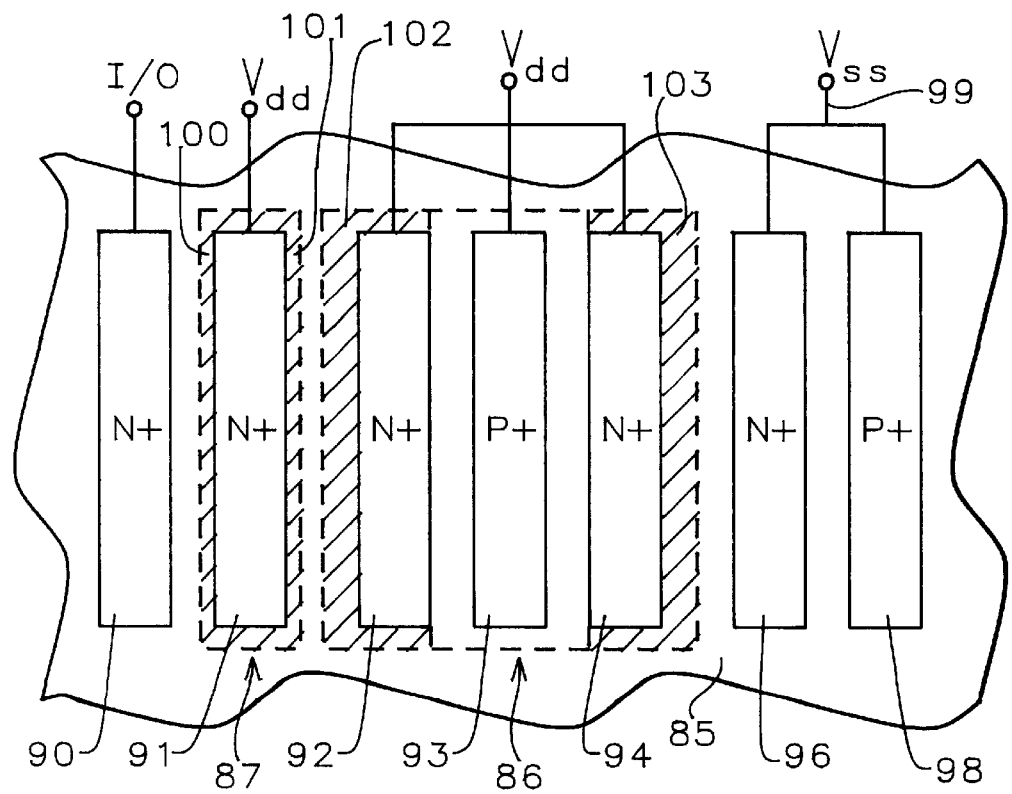
FIG. 5 is a plan view of the structure shown in FIG. 4 showing the configuration of the conductive guard structures.

FIG. 5 is a plan view of the structure shown in FIG. 4 showing the configuration of the conductive guard structures 100–103 and the regions 91, 92, 93, and 94, etc. In this structure, the values are as follows:

$R_S$=20–50 ohms/square.

$R_S$ well≧1000 ohms/square

For an N− substrate, with a minority carrier guard structure, the N and P doping values are reversed. In addition, the N+ well, $V_{DD}$ and P− well, $V_{SS}$ are also reversed. In the case of an N− substrate, the N+ is converted to P+, the P+ is converted N+, and N− well is converted to P− well, $V_{DD}$ is converted to $V_{SS}$ and $V_{SS}$ is converted to $V_{DD}$.

The process of manufacture of a device in accordance with this invention comprises the conventional process of forming a MOSFET device modified by digging a trench and filling the trench with a conductor composed of metal or doped polysilicon comprising conductive guard structures 100–103. First, a mask is applied to the surface of the substrate. The mask comprises photoresist which is to be patterned to define the trench areas in the wells. The photoresist is exposed and developed and then openings are etched for the purpose of forming the trenches into which conductive guard structures 100–103 are deposited. Next N+ ions are implanted into the conductive guard structures 100–103 in the trenches. The chemical species of the dopant implanted is selected from the group of dopants consisting of phosphorous P31 or Arsenic As75 with a dose of between about 1E16 atoms/cm² about 1E18 atoms/cm², at an energy of between about 50 keV and about 100 keV. At the end of the etching process, the resist is removed by a conventional process.

In the case of heavily doped polysilicon in the trench, the polysilicon is preferably applied by the process of thermal reaction of a liquid source of phosphorous dopant $POCl_3$ or the process of N+ ion implantation. The P+ dopant is applied to the P− well and N− sub.

FIGS. 6A and 6 B illustrate the process required to form the conductive guard structures 100–103.

Referring to FIG. 6A, in the first stage, N-wells 86 and 87 are formed in the P− substrate 85. Substrate 85 doped P− is coated with field oxidation (FOX) structures 37 over the junctions of the N− wells 86, 87 with the remainder of the P− substrate 85 and spaced otherwise along the surface of the substrate and N-well 86. A blanket APCVD oxide layer 39 is deposited over the FOX structures 37 and the exposed surfaces of the P− substrate 85 and the exposed surfaces of the N-wells 86 and 87. Next, the structure is coated with a layer of photoresist 88. Next trench masking is provided as the photoresist is patterned using conventional photolithography to develop the photoresist, forming mask openings 95, 96, 98 and 99 in the photoresist layer 88. Next an oxide etch of layer 39 and FOX 37, and silicon 85 is etched next through the mask openings 95, 96, 98 and 99 down into the outer walls of wells 86 and 87 (to form trenches for guard structures 100–103 along the borders at the periphery of said N-wells 86 and 87 as seen in FIG. 6B).

Referring to FIG. 6B, the photoresist layer 88 has been removed. Metal or polysilicon layer 110 is deposited next upon the exposed surface of oxide layer 39 and down through the mask openings into the trenches 95, 96, 98 and 99 to form the guard structures 100–103. Next, as an optional step, the polysilicon layer 110 is doped or implanted in a conventional way.

Next, the polysilicon layer 110 is etched to remove surplus material in a conventional way. The subsequent step is that APCVD oxide layer 39 is etched.

A sacrificial oxide step follows. Next a conventional threshold voltage ($V_T$) implantation is performed. A cleaning step is performed followed by a gate oxidation step. Next, a conventional polysilicon gate deposition is performed. The value of $R_W$ is preferably about three orders of magnitude lower in ohms/square than a conventional well $R_W$ with the trenches filled with a guard conductor structure of highly conductive material.

The minority carrier guard structure is improved by providing a deeper current collector as compared with the N+ or P+ junctions or with a well. The improved structure makes $R_W$ lower than the conventional value which improves the efficiency of the minority carrier guard structure.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of enhancing latch-up immunity for an integrated circuit device comprising:

providing a semiconductor substrate of a first conductivity type;

providing a first well region within the semiconductor substrate, the first well region doped to a second conductivity type;

providing a first doped region within the first well region, the first-doped region doped to the second conductivity type at a higher concentration than the first well region, the first doped region extending laterally across the first well;

forming a first trench extending from a surface of the semiconductor substrate and at least partially surrounding the first doped region;

filling the first trench with a conductive material;

providing a second well region within the semiconductor substrate, the second well region doped to the second conductivity type;

providing within the second well region a second doped of the second conductivity type doped more highly than the second well region; and providing a contact region of the second conductivity type in contact with the semiconductor substrate, the second well region provided on a first side of the first well region and the contact provided on another side of the first well region.

2. The method of claim 1, wherein the first well region extends from the surface of the semiconductor substrate to a greater depth than the first trench.

3. The method of claim 2, wherein the conductive material is a metal or polysilicon doped to the second conductivity type.

4. The method of claim 1, wherein the first trench surrounds the first doped region.

5. The method of claim 1, further comprising;

connecting the second doped region to a first supply voltage for the integrated circuit device; and connecting the first doped region to the first supply voltage.

6. The method of claim 5, further comprising:

forming a second trench extending from a surface of the semiconductor substrate and at least partially surrounding the second doped region; and filling the second trench with the conductive material.

7. The method of claim 6, further comprising the step of providing a third doped region within the second well region, the third doped region doped to the second conductivity type at a higher concentration than the first well region.

8. The method of claim 7, further comprising the steps of:

forming a third trench extending from the surface of the semiconductor substrate along an edge of the second well region, the third trench positioned so that the third doped region will be formed in contact with the third trench;

filing the third trench with the conductive material; and connecting the third doped region to the first supply voltage.

9. The method of claim 8, wherein the second and third trenches are spaced apart and partially surround a fourth doped region provided within the second well region and doped to the first conductivity type.

10. The method of claim 6, further comprising the step of providing a third doped region within the second well region, the third doped region doped to the first conductivity type and having a higher dopant concentration than the second well region.

11. The method of claim 10, further comprising the step of connecting the third doped region to the first power supply voltage.

12. The method of claim 11, wherein the second trench is spaced from the third doped region.

13. The method of claim 11, further comprising the step of providing a fourth doped region within the second well region, the fourth doped region doped to the second conductivity type at a higher concentration than the second well region.

14. The method of claim 13, further comprising the steps of:

forming a third trench extending from a surface of the semiconductor substrate along an edge of the fourth doped region and an edge of the second well region;

filling the third trench with conductive material; and connecting the fourth doped region to the first power supply voltage.

15. The method of claim 14, wherein the second, third and fourth doped regions are rectangular and arranged parallel to one another.

16. A method of enhancing latch-up immunity for an integrated circuit device, the device comprising a semiconductor substrate of a first conductivity type, a second well region within the semiconductor substrate doped to a second conductivity type, at least one second doped region within the second well region, the method comprising:

providing a first well region within the semiconductor substrate, the first well region doped to the second conductivity type;

providing a first doped region within the first well region, the first doped region doped to the second conductivity type at a higher concentration than the first well region, the first doped region being substantially the only doped region within the first well;

forming a first trench extending from a surface of the semiconductor substrate and at least partially surrounding the first doped region; and filling the first trench with a conductive material.

17. The method of claim 16, wherein at least one of the second doped region is connected to a first supply voltage for the integrated circuit device, further comprising:

connecting the first doped region to the first supply voltage.

18. The method of claim 17, further comprising:

forming a second trench extending from a surface of the semiconductor substrate and at least partially surrounding a second doped region; and filling the second trench with the conductive material.

19. A method of enhancing latch-up immunity for an integrated circuit device comprising:

providing a semiconductor substrate of a first conductivity type;

providing a first well region within the semiconductor substrate, the first well region doped to the second conductivity type;

providing a first doped region within the first well region, the first doped region doped to the second conductivity type at a higher concentration than the first well region, the first doped region being substantially the only doped region within the first well;

forming a first trench extending from a surface of the semiconductor substrate and at least partially surrounding the first doped region;

filling the first trench with a conductive material;

providing a second well region within the semiconductor substrate, the second well region doped to a second conductivity type;

providing a second doped region within the first well region, the second doped region doped to the second conductivity type at a higher concentration than the second well region;

forming a second trench extending from a surface of the semiconductor substrate along an edge of the second doped region;

filling the second trench with a conductive material;

providing a third doped region within the second well region, the third doped region doped to the third conductivity type at a higher concentration than the second well region;

forming a third trench extending from a surface of the semiconductor substrate along an edge of the third doped region;

filling the third trench with the conductive material;

providing a fourth doped region within the second well region, the fourth doped region doped to the first conductivity type, wherein the second and third trenches are spaced apart and partially surround the fourth doped region, and wherein the second, third and fourth doped regions have a length greater than a width and are arranged parallel to one another, providing a contact region of the second conductivity type in contact with the semiconductor substrate, the second well region provided on a first side of the first well region and the contact provided on another side of the first well region; and connecting the first, second, third and fourth doped regions to a first supply voltage for the integrated circuit device.

* * * * *